United States Patent [19]

Guzzi

[11] Patent Number: 4,696,891

[45] Date of Patent: Sep. 29, 1987

[54] PROCESS FOR THE PRODUCTION OF NEGATIVE RELIEF COPIES USING PHOTOSENSITIVE COMPOSITION HAVING 1,2-QUINONE DIAZIDE AND QUATERNARY AMMONIUM COMPOUND

[75] Inventor: Alberto Guzzi, Verona, Italy

[73] Assignee: Hoechst Aktiengesellschaft, Fed. Rep. of Germany

[21] Appl. No.: 892,893

[22] Filed: Aug. 1, 1986

Related U.S. Application Data

[62] Division of Ser. No. 667,154, Nov. 1, 1984, abandoned.

[30] Foreign Application Priority Data

Nov. 8, 1983 [IT] Italy .................................. 23634 A/83

[51] Int. Cl.$^4$ ............................. G03F 7/08; G03F 7/26
[52] U.S. Cl. ..................................... 430/325; 430/302; 430/309; 430/328; 430/330; 430/331
[58] Field of Search ............... 430/326, 328, 330, 325, 430/331, 302, 309

[56] References Cited

U.S. PATENT DOCUMENTS

| | | | |
|---|---|---|---|
| 3,046,110 | 7/1962 | Schmidt | 96/33 |
| 3,046,114 | 7/1962 | Süs | 96/33 |
| 3,061,430 | 10/1962 | Endermann et al. | 96/33 |
| 3,106,465 | 10/1963 | Neugebauer et al. | 96/33 |
| 3,130,047 | 4/1964 | Uhlig et al. | 96/33 |
| 3,130,048 | 4/1964 | Fritz et al. | 96/33 |
| 3,130,049 | 4/1964 | Neugebauer et al. | 96/33 |
| 3,188,210 | 6/1965 | Fritz et al. | 96/33 |
| 4,104,070 | 8/1978 | Moritz et al. | 430/325 |
| 4,196,003 | 4/1980 | Watanabe | 430/325 |
| 4,546,066 | 10/1985 | Field et al. | 430/323 |

FOREIGN PATENT DOCUMENTS 729746 1/1952 United Kingdom .
1339663 12/1973 United Kingdom .
2082339 3/1982 United Kingdom .

OTHER PUBLICATIONS

A. Ledwith, "Chemistry of Polymeric Resists Useful in Microlithography", Oct. 1983, IEE Proceedings, vol. 130, Pt. I, No. 5, pp. 245 through 251.

Primary Examiner—Charles L. Bowers, Jr.
Attorney, Agent, or Firm—Schwartz, Jeffery, Schwaab, Mack, Blumenthal & Evans

[57] ABSTRACT

A process for the production of negative relief copies, wherein a photosensitive material comprising at least one o-quinone diazide and at least one quaternary ammonium compound is imagewise exposed, heated, and then uniformly exposed before developing, involves reduced heat-treatment temperatures and durations, and does not require the use of toxic amines.

3 Claims, No Drawings

PROCESS FOR THE PRODUCTION OF NEGATIVE RELIEF COPIES USING PHOTOSENSITIVE COMPOSITION HAVING 1,2-QUINONE DIAZIDE AND QUATERNARY AMMONIUM COMPOUND

This application is a division of application Ser. No. 667,154, filed 11/01/84, now abandoned.

BACKGROUND OF THE INVENTION

The present invention relates to a photosensitive composition which is particularly intended for the production of printing plates and is capable of yielding either a positive or a negative copy of an original, i.e., a positive copy can be produced either from a positive original or from a negative original.

In reproduction technique, supports of widely differing types which comprise various materials, and which are coated with photosensitive coatings, have been in general use for a long time in a very broad field which ranges from offset printing to the production of printed circuits. The photosensitive coatings are usually divided into two groups, i.e., negative-working coatings, by which a positive copy can be produced from a negative original, and positive-working coatings, by which a positive copy can be produced from a positive original.

The nature of negative-working coatings is such that the areas which have not been exposed to actinic light and have therefore remained unchanged are dissolved by a developer, as a result, a negative image is formed. In positive-working coatings, on the other hand, only those areas which have been exposed to actinic light are rendered soluble in an alkaline developer, and thus a positive image is formed.

For positive-working photosensitive coatings, o-naphthoquinone diazides are, at present, generally used. Material of this type are described, for example, in German Pat. Nos. 854,890; 865,109; 879,203; 894,959; 938,233; 1,124.,817; 1,109,521; 1,120,273; 1,118,606 and 1,114,705, and in U.S. Pat. No. 3,635,709. These o-naphthoquinone diazides make it possible to prepare positive-working photosensitive coatings which are of high stability and can easily be developed with aqueous-alkaline solutions, so that it is not necessary to employ developers on a basis of organic solvents.

The prior art has also disclosed photosensitive coatings based on o-quinone diazides, which undergo image reversal when they are heated for a particular period of time after exposure, such that a positive image is obtained from a negative original, and vice versa.

German Offenlegungeschrift No. 2,529,054 describes photosensitive coatings of the above-mentioned type. In these coatings, 1-hydroxyethyl-2-alkylimidazoline must be present, and a plate provided with such a coating must be heated at 105° C. for at least 10 minutes. Photosensitive coatings of the above-indicated type are, moreover, described in German Offenlegungsschrift No. 2,855,723; the disclosed reversal process is effected by substances of the type

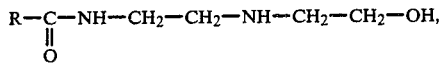

but the plate must also be heated for at least 10 minutes, at temperatures above 100° C. Published European Patent Application No. 24,916 discloses a composition which contains a photosensitive compound and, additionally, a resin belonging to the group of novolaks. This composition, which permits the production of both positive and negative copies from a positive original, must be heated for 30 minutes at 95° C. or for 5 minutes at 150° C. to effect the reversal process.

Published British Patent Application No. 2,082,339A describes a photosensitive coating for lithographic plates, which is based on o-quinone diazides and resol resins and which permits the formation of positive images from positive and also from negative originals. For the reversal process, this coating must be heated to at least 120° C., if the treatment is to take no longer than 2 minutes.

U.S. Pat. No. 4,196,003 describes the use of o-napthoquinone diazides in the production of presensitized printing plates which can form positive or negative images, depending on the treatment to which the photosensitive coating is subjected. If the plate is exposed through a *positive* original and thereafter developed with an alkaline solution in the usual manner, such that the exposed areas are removed by dissolution, a positive image is obtained.

On the other hand, a positive image is formed if the plate is exposed through a *negative* original, heated for about 10 minutes at about 100° C. after imagewise exposing, then subjected to an overall exposure using the same light source as before, and finally developed in the above-indicated alkaline developer. In the last-mentioned process, the action of heat causes a cross-linking reaction to occur in the imagewise exposed areas of the coating, by which the coating is rendered insoluble in the alkaline developer, whereas the remaining areas become soluble in the second exposure.

The photosensitive coating which is used to perform this reversal process comprises at least one o-naphthoquinone diazide, a phenol or cresol formaldehyde resin, and at least one secondary or tertiary amine. This amine acts as a catalyst in the thermal cross-linking process.

Amines are known to be toxic. The presence of an amine in the photosensitive coating constitutes a hazard to the health of persons who handle these materials and is also a potential source of contamination, since the temperatures to which the coating is subjected during the application and treatment thereof are so high that portions of the amines tend to evaporate into the surrounding atmosphere. Moreover, part of the coating and, consequently, also the amine contained therein, is dissolved in the developing procedure and it is, therefore, necessary to take particular measures in order to detoxify the spent developer.

The toxicity of the coating additives and the duration of the heat treatment are thus to be regarded as disadvantages of the prior art. Consumers wish to have materials requiring short treatment times.

SUMMARY OF THE INVENTION

According to the present invention, it has surpisingly been found that photosensitive coatings which permit a positive as well as a negative reproduction of an image can be produced for which amines are not required and for which heat treatment times are reduced by up to about 80%, at temperatures which are up to 20% lower, compared to the prior art.

It is an object of the present invention to provide a photosensitive composition based on 1,2-quinone diazides and a process, respectively, by which it is possible to effect image reversal.

It is another object of the invention to shorten processing times, to reduce processing temperatures, and to prevent the risk of gases or vapors being generated during processing which are injurous to health.

In accomplishing the foregoing objects, there has been provided, in accordance with one aspect of the present invention, a photosensitive composition which comprises at least one 1,2-quinone diazide, as the photosensitive compound, and which additionally contains a quaternary ammonium compound. In a preferred embodiment of the present invention, the quaternary ammonium compound comprises a tetraalkyl ammonium compound, a trialkylaryl ammonium compound, and a N-alkylpyridinium compound.

In accordance with another aspect of the present invention, there has been provided a process for producing negative relief copies, comprising the steps of (i) imagewise exposing a photosensitive material which comprises (a) at least one 1,2-quinone diazide and (b) a quaternary ammonium compound; (ii) thereafter heating the photosensitive material, then, after cooling, (iii) uniformly exposing the photosensitive material, and, after step (iii), (iv) developing by means of an aqueous-alkaline developer.

Other objects, features, and advantages of the present invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF PREFERRED EMBODIMENTS

Photosensitive 1,2-quinone diazides which are suitable for the present invention are described, for example, in *Light-Sensitive Systems*, by J. Kosar, published by John Wiley and Sons, Inc., New York, and also in any of the aforementioned patent-related documents. The contents of the Kosar publication and the cited patent-related documents are therefore incorporated herein by reference.

The photosensitive material of the present invention contains, in addition to a 1,2-quinone diazide, a quaternary ammonium compound. The quaternary ammonium compound, which acts as a crosslinking catalyst, advantageously comprises a hydroxide or a salt of a tetraalkyl ammonium or trialkylaryl ammonium compound or a N-alkylpridinium derivative. Examples of such compounds include the halides, p-toluene sulfonates, tetrabutyl ammonium hydroxide, trimethylphenyl ammonium hydroxide, benzyltrimethyl ammonium hydroxide and coconut oil alkyldimethylbenzyl ammonium hydroxide (in which the coconut oil alkyl radical is a mixture of alkyl radicals having from 10 to 18 carbon atoms, the majority being radicals having 12 carbon atoms).

The quaternary ammonium compounds exist as hydroxides substantially only in aqueous or alcoholic solutions. They can be obtained from their corresponding salts by treating these salts with an anion-exchange resin, prior to or after their addition to the coating solution, as described in the examples which follow. The ratio of o-quinone diazide to quaternary ammonium compound may range between about 0.03 and 0.5 part by weight of quaternary ammonium compound per 1 part by weight of o-quinone diazide.

In addition to the above-specified constituents, the photosensitive coating of the present invention may contain other components, for example, dyes, indicators or pigments, to render the image readily visible, various types of resins to improve the developability of the coating or to increase its mechanical strength, surfactants, combinations of components which effect a color change, and other conventional additives. It is also known to be particularly advantageous to add polymeric binders which are insoluble in water and soluble in aqueous-alkaline solutions. Phenolic resin novolaks have proved to be especially suitable for this purpose.

A photosensitive material is prepared by uniformly applying the photosensitive coating to a support, such as a metal plate comprising, for example, aluminum, chromium-plated steel, steel which is copper clad and chromium-plated, or chromium-plated brass. The dry coating has a weight which may range between about 0.1 and 5 g/m$^2$.

The material so prepared is exposed to actinic light through a film original, in a conventional manner. Light sources which can be employed are, for example, a xenon lamp, a metal halide lamp, or an arc lamp. In the preparation of a positive printing plate, exposure is followed by development in an aqueous-alkaline solution, for example, a 5% strength aqueous solution of sodium silicate. In order to obtain a negative printing plate, exposure must be followed by a heat treatment which, in turn, is followed by a second exposure of the entire plate surface, appropriately using the same actinic light, for a period of time which is sufficient to render the areas of the coating which were not struck by light in the imagewise exposure soluble in the developing procedure. The plate is then developed in the same alkaline developer as used above.

In the photosensitive coating according to the present invention, toxicity problems do not exist, since the amines are replaced by the nontoxic quaternary ammonium compounds, which have been employed as disinfectants for internal and external applications, and as cationic surfactants. They are widely used in pharmacy and industry and as detergents.

Using the composition of the present invention, it is, moreover, possible to perform heat treatment at lower temperatures, and within shorter periods of time, than in the case of prior art compositions of the same type. After imagewise exposure, the composition is usually heated to about 80° to 120° C., preferably to 95° to 105° C. The heating time generally ranges between 0.5 and 5 minutes, preferably between 1 and 4 minutes.

The following examples illustrate preferred embodiments of the invention. Quantitative proportions and percentages are to be understood as being units of weight, unless otherwise indicated. Parts by weight (p.b.w.) and parts by volume (p.b.v.) are related as g to cm$^3$. For a comparison between the compositions of the present invention and the amine-containing compositions of the prior art, various offset-printing plates were prepared which had the same constituents, except for the additive. The additives which were used and compared with each other included the amines described in U.S. Pat. No. 4,196,003, comprising triethanolamine, diethylaniline and hexamethylenetetramine and the quaternary ammonium compounds comprising tetrabutyl ammonium hydroxide, coconut oil alkyldimethylbenzyl ammonium hydroxide and benzyltrimethyl ammonium bromide.

EXAMPLE 1

Six coating solutions were prepared.

SOLUTION A 1.5 p.b.w. of the reaction product obtained from 1,2-naphthoquinone-2-diazide-4-sulfonyl chloride and a cresolformaldehyde novolak having a softening range from 105° to 120° C. (measured according to the capillary method, DIN 53,181), 1.5 p.b.w. of the same novolak which had, however, not been esterified, and 0.3. p.b.w. of triethanolamine were dissolved in 30 p.b.w. of 2-ethoxy-ethanol.

SOLUTION B

The same composition as in solution A, but with 0.3 p.b.w. of diethylaniline substituted for the 0.3 p.b.w. of triethanolamine.

SOLUTION C

The same composition as in solution A, but with 0.25 p.b.w. of hexamethylenetetramine substituted for the 0.3 p.b.w. of triethanolamine.

SOLUTION D

The same composition as in solution A, but with 2 p.b.w. of an about 10% strength solution of tetrabutyl ammonium hydroxide, which had been prepared as described below in Example 3 substituted for the 0.3, p.b.w. of triethanolamine.

SOLUTION E

The same composition as in solution A, but with 2 p.b.w. of an about 10% strength solution of coconut oil alkyldimethylbenzyl ammonium hydroxide substituted for the 0.3 p.b.w. of triethanolamine.

SOLUTION F

The same composition as in solution A, but with 0.2 p.b.w. of benzyltrimethyl ammonium bromide substituted for the 0.3 p,b,w, of triethanolamine.

Each of these solutions was coated onto a support of chromium-plated steel. After removal of the solvent, the six plates obtained in this manner were exposed through the same negative original, then subjected to a temperature of 100° C.±5° C. for 2 minutes, exposed again without the original, and thereafter developed for 1 minute in a 3% strength solution of sodium silicate, as specified in Example 1 of U.S. Pat. No. 4,196,003. After this treatment, only the coatings prepared from solutions D, E and F yielded a positive image, whereas the coatings obtained from solutions A, B and C had been completely dissolved by the developing solution, leaving the bare supports.

It was found that the dwell time at 100° C.±5° C. had to be extended to at least 10 minutes to obtain an acceptable positive image by means of the three last-mentioned coatings. This longer dwell time is, in fact, employed in the examples of U.S. Pat. No. 4,196,003.

When a 5% strength aqueous solution of sodium silicate was used for developing, as specified in Examples 5 and 6 of U.S. Pat. No. 4,196,003, the results obtained differed even more clearly, favoring solutions D, E and F.

The 5% strength sodium silicate solution is actually more like the developers which are conventionally used for presensitized positive working offset-printing plates than the 3% strength sodium silicate solution. Because considerably shortened treatment times can be used, without having concomitantly to raise the treatment temperature, the compositions containing quaternary ammonium compounds, which are used according to the present invention, prove to be particularly favorable in application.

EXAMPLE 2

1.5 p.b.w. of the reaction product obtained from 1,2-naphthoquinone-2-diazide-4-sulfonyl chloride and novolak, as used in Example 1, 1.5 p.b.w. of the novolak of Example 1, and 0.1 p.b.w. of tetrabutyl ammonium bromide were dissolved in 60 p.b.w. of 2-ethoxy-ethanol. The solution was then treated with 6 p.b.w. of a weak anion-exchange resin for about 15 minutes with moderate stirring. The anion-exchange resin was then filtered off and 0.02 p.b.w. of bromphenol blue was dissolved in the filtered solution. The resulting solution was applied to an electrolytically roughened aluminum plate. The photosensitive plate obtained after evaporation of the solvent was covered with a dry coating having a weight per unit area of about 2 g/m$^2$.

(A) PRODUCTION OF A REVERSED IMAGE

The plate was exposed, in the conventional manner, for 90 seconds through a negative film original using as the light source a 5kW metal halide lamp disposed at a distance of 100 cm. After exposure, the plate was heated for two minutes at 100° C. and then exposed again without the original for 90 seconds under the same light source. By developing the resultant plate for 30 seconds with a 5% strength sodium silicate solution, a positive image was produced. The plate could successfully be used as an offset-printing plate.

(B) PRODUCTION OF A POSITIVE IMAGE

In order to produce a positive image from a positive original, the above-described operations were repeated, but with the differences that the heat treatment and second exposure were omitted and the plate was developed after the first exposure. As a result, a positive image was obtained, since the exposed areas of the coating were dissolved by the developer. The plate could successfully be used as an offset-printing plate.

EXAMPLE 3

1.5 p.b.w. of the reaction product obtained from 1,2-naphthoquinone-2-diazide-4-sulfonlyl chloride and novolak, as in Example 1, and 1.5 p.b.w. of novolak were dissolved in 58 p.b.w. of 2-ethoxy-ethanol. The solution was admixed with 2 p.b.v. of an approximately 10% strength solution of tetrabutyl ammonium hydroxide, which had been prepared as described below. The resultant photosensitive solution was spin-coated onto a chromium-plated steel plate. After evaporation of the solvent, a photosensitive plate resulted, which was covered with a dry coating having a weight per unit area of about 2 g/m$^2$.

(A) PRODUCTION OF A REVERSED IMAGE

According to the procedure in Example 2a, a positive image was obtained from a negative original. The plate thus prepared was successfully used as an offset-printing plate.

(B) PRODUCTION OF A POSITIVE IMAGE

According to the procedures described in Example 2b, a positive image was obtained from a positive original. The plate prepared in this manner was successfully used as an offset-printing plate.

(C) PREPARATION OF THE TETRABUTYL AMMONIUM HYDROXIDE SOLUTION IN 2-ETHOXY-ETHANOL 5 p.b.w. of tetrabutyl ammonium bromide was dissolved in 45 p.b.w. of 2-ethoxy-ethanol, at room temperature. The solution was admixed with 5 p.b.w. of a weak anion-exchange resin. After 15 minutes of moderate stirring, the ion exchanger was filtered off.

EXAMPLE 4

The procedure of Example 2 was repeated, except that 1,5 p.b.w. of the reaction product obtained from 1,2-naphthoquinone-2-diazide-5-sulfonyl chloride and novolak was used in lieu of the reaction product indicated in Example 2. The results obtained were substantially the same as those of Example 2.

EXAMPLE 5

2.6 p.b.w. of novolak, 0.4 p.b.w. of 2,3,4-trihydroxy-benzophenone-bis(1,2-naphthoquinone-2-diazide-5-sulfonic acid ester), and 1 p.b.v. of the tetrabutyl ammonium hydroxide solution described in Example 3c were dissolved in 30 p.b.w. of 2-ethoxy-ethanol. The photosensitive solution prepared in this manner was used to coat a trimetal plate comprising a steel plate covered with an about 5 $\mu$m thick copper layer and an about 1.5 $\mu$m thick layer of crystalline chromium applied on top of the copper layer. The photosensitive coating which was present on the plate had a weight of about 3.5 g/m$^2$.

By treating the plate according to one of the two procedures described in the preceding examples, either a positive image was obtained from a negative original or a positive image was obtained from a positive original. The chromium layer which had been uncovered in the developing procedure was etched. For this purpose, a solution composed of 70 p.b.w. of anhydrous zinc chloride and 5 p.b.w. of concentrated hydrochloric acid in 25 p.b.w. of water was used. In the etching process, the chromium layer was dissolved and the copper surface was bared in accordance with the image formed by the superposed organic coating. After etching, the organic coating was completely detached by means of 2-ethoxy-ethanol. As a result, an image comprises of the two metals, copper and chromium, was formed on the plate. This plate yielded excellent results when it was used as an offset-printing plate for large print runs.

EXAMPLE 6

2.6 p.b.w. of novalk, 0.4 p.b.w. of p-tert-butylphenol-1,2-naphthoquinone-2-diazide-5-sulfonic acid ester and 0.2 p.b.w of trimethylbenzyl ammonium bromide were dissolved in 60 p.b.w. of 2-methoxy-ethanol and this solution was used to coat an electrochemically roughened and anodically oxidized aluminum plate. By treating the photosensitive plate thus produced according to the alternative procedures described in the preceding examples, a negative or a positive offset-printing plate was obtained, depending on the treatment. In either case, the resulting plate had good printing properties and yielded large print runs.

EXAMPLE 7

By repeating the procedure of Example 2, but using 0.1 p.b.w. of hexadecylpyridinium chloride instead of the 0.1 p.b.w. of tetrabutyl ammonium bromide, the results obtained were similar to those of Example 2.

EXAMPLE 8

By repeating the procedure of Example 6, but replacing the trimethylbenzyl ammonium bromide by the same quantity of a 50% strength aqueous solution of coconut oil alkyldimethylbenzyl ammonium chloride, practically the same results as in Example 6 were obtained.

EXAMPLE 9

The procedure of Example 8 was repeated, except that the quantity of 0.2 p.b.w. of 50% strength aqueous solution of coconut oil alkyldimethylbenzyl ammonium chloride was replaced by 2 p.b.v. of a coconut oil alkyldimethylbenzyl ammonium hydroxide solution which had been prepared by dissolving 5 p.b.w. of a 50% strength aqueous solution of coconut oil alkylidmethylbenzyl ammonium chloride in 45 p.b.w of 2-methoxy-ethanol; the solution had been admixed with 5 p.b.w. of a weak anion-exchange resin and the resin had been filtered off after 15 minutes of moderate stirring. The results obtained essentially corresponded to those of Example 6.

EXAMPLE 10

3 p.b.w. of the reaction product obtained from 1,2-naphthoquinone-2-diazide-5-sulfonyl chloride and novlak and 2 p.b.w. of coconut oil alkyldimethylbenzyl ammonium hydroxide solution, the preparation of which is described in Example 9, were dissolved in 58 p.b.w. of 2-methoxy-ethanol, with the procedure described in Example 2, this solution could be used to produce high-quality offset-printing plates, which yielded a positive or a negative image, depending on the treatment performed.

What is claimed is:

1. A process for the production of negative relief copies, comprising the steps of
   (i) imagewise exposing a photosensitive material uniformly applied as a coating to a support, which material comprises in admixture (a) at least one photosensitive 1,2-quinone diazide which is present in an amount sufficient to impart light-sensitivity to said coating (b) a quaternary ammonium compound which is present in an amount between 0.03 and about 0.5 parts by weight per 1 part by weight of said diazide; and (c) a polymeric binder which is insoluble in water and soluble in aqueous-alkaline solutions, said binder being present in an amount sufficient to stabilize said coating structurally;
   (ii) after step (i), heating said photosensitive material at a temperature ranging between about 80° to 120° C. for about 0.5 to 5 minutes; then
   (iii) after cooling said coating, uniformly exposing said photosensitive material; and
   (iv) after step (iii), developing said photosensitive material by means of an aqueous-alkaline developer, such that areas of said photosensitive material not exposed in step (i) are solubilized.

2. A process as claimed in claim 1, wherein step (ii) comprises heating said photosensitive material to a temperature in the range from about 95° to about 105° C.

3. A process as claimed in claim 1, wherein said photosensitive the material is heated during step (ii) for about 1 to about 4 minutes.

* * * * *